(12) United States Patent
Johnson et al.

(10) Patent No.: US 6,429,103 B1
(45) Date of Patent: Aug. 6, 2002

(54) MOCVD-GROWN EMODE HIGFET BUFFER

(75) Inventors: Eric Shanks Johnson, Scottsdale; Nyles Wynn Cody, Tempe, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/548,791

(22) Filed: Apr. 13, 2000

(51) Int. Cl.$^7$ .................. H01L 21/265; H01L 21/20; H01L 21/36; H01L 21/38
(52) U.S. Cl. .................. 438/518; 438/483; 438/569; 438/930
(58) Field of Search .................. 438/95, 518, 930, 438/483, 569, 167; 257/190, 192, 94, 98

(56) References Cited

U.S. PATENT DOCUMENTS

| | | | | |
|---|---|---|---|---|
| 5,479,033 A | * | 12/1995 | Baca et al. | 257/192 |
| 5,581,396 A | * | 12/1996 | Kubota et al. | 359/332 |
| 5,656,382 A | * | 8/1997 | Nashimoto | 428/620 |
| 5,659,188 A | * | 8/1997 | Kao et al. | 257/190 |
| 5,981,976 A | * | 11/1999 | Murasato | 257/94 |
| 6,208,005 B1 | * | 3/2001 | Mitra | 257/442 |

FOREIGN PATENT DOCUMENTS

| | | |
|---|---|---|
| EP | 0690511 A1 | 1/1996 |
| WO | WO 92/15113 | 9/1992 |
| WO | WO 93/23877 | 11/1993 |

OTHER PUBLICATIONS

McMorrow et al., "Elimination of Charge–Enhancement Effects in a GaAs FETs with a Low–Temperature Grown GaAs Buffer Layer," IEEE Transactions on Nuclear Science, vol. 42, No. 6, Dec. 1995, pp. 1837–1843.

Mihashi et al., Influence of Oxygen on the Threshold Current of AlGaAs Multiple Quantum Well Lasers Grown 141, Aug. 1994, Nos. 1/2, pp. 22–28.

* cited by examiner

*Primary Examiner*—John F. Niebling
*Assistant Examiner*—Walter L. Lindsay, Jr.

(57) ABSTRACT

A method of fabricating an Emode HIGFET semiconductor device, and the device, is disclosed including epitaxially growing by metal-organic chemical vapor deposition an epitaxial buffer. The buffer includes a layer of short-lifetime gallium arsenide on a gallium arsenide substrate and a layer of aluminum gallium arsenide on the layer of short-lifetime gallium arsenide. The short-lifetime gallium arsenide is grown at a temperature below approximately 550° C. so as to have a lifetime less than approximately 500 picoseconds. A stack of compound semiconductor layers is then epitaxially grown on the layer of aluminum gallium arsenide of the buffer and an Emode field effect transistor is formed in the stack.

11 Claims, 1 Drawing Sheet

MOCVD-GROWN EMODE HIGFET BUFFER

FIELD OF THE INVENTION

This invention relates to apparatus and method for growing epitaxial layers of compound semiconductor material on a compound semiconductor substrate using Metal Organic Chemical Vapor Deposition techniques.

BACKGROUND OF THE INVENTION

At present, epitaxial layers for enhancement mode (Emode) HIGFET devices are grown directly on a substrate using the molecular beam epitaxy (MBE) process with only a GaAs buffer layer. MBE epitaxial growth is slow and expensive, which severely limits the quantity of available material and substantially adds to the cost of devices.

Attempts to grow Emode devices by the faster and cheaper Metal Organic Chemical Vapor Deposition (MOCVD) process have not been successful. Previous MOCVD-grown Emode devices have had poor repeatability and often high leakage currents, so high that they are unusable. Some success has been realized in the growth of depletion-mode FETs using MOCVD. See for example an article by N. Pan et al., *J. Electron, Mat.* 21, 199 (1992) and an article by Sasajima et al., "High Resistivity Oxygen-Doped AlGaAs for Power Devices", *Proc. of MRS*, November 1997. However, it is commonly believed in the art that Emode HIGFET devices cannot be successfully grown by the MOCVD process.

Accordingly, it is highly desirable to provide Emode HIGFET devices by the MOCVD process and to provide a new method of forming high performance Emode epitaxial structures by the MOCVD process. Fabricating epitaxial layers of Emode devices using the MOCVD process will permit cost reduction and ensure an adequate supply of device-quality material.

BRIEF DESCRIPTION OF THE DRAWINGS

Referring to the drawings.

DESCRIPTION OF THE PREFERRED EMBODIMENTS

Figure 1:
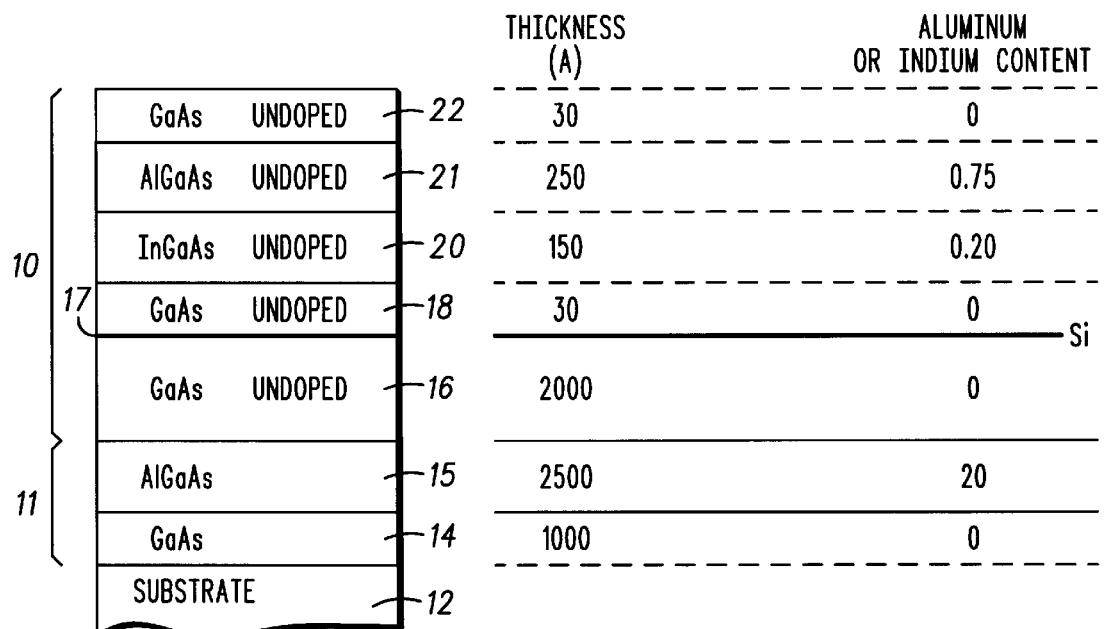
FIG. 1 is a cross-sectional view of a stack of layers of compound semiconductor material making up an active EMode device on a buffer epitaxially grown by the MOCVD process in accordance with the present invention.

Turning now to the drawings and specifically to FIG. 1, a cross-sectional view is illustrated of a stack 10 of compound semiconductor material positioned on a buffer 11 in accordance with the present invention. A compound semiconductor substrate 12 is provided, which in the preferred embodiment is formed of semi-insulating gallium arsenide (siGaAs). Buffer 11 includes a layer 14 of compound semiconductor material, which in this preferred embodiment includes GaAs, epitaxially grown on the upper surface of substrate 12 by the process of Metal Organic Chemical Vapor Deposition (MOCVD).

It has been found that the very high leakage current of enhancement mode devices previously grown on a substrate by the MOCVD process is due primarily to a contaminated surface of the substrate or a contaminated interface between the substrate and the epitaxial layers. A contamination of a few parts per billion is sufficient to cause leakage at the interface. It is virtually impossible to prepare a substrate without producing some contamination of the substrate surface. These contaminants at the substrate-epi interface produce mobile carriers that in turn produce the high leakage current which is detrimental to an enhancement device formed in the epitaxial layers.

Figure 2:
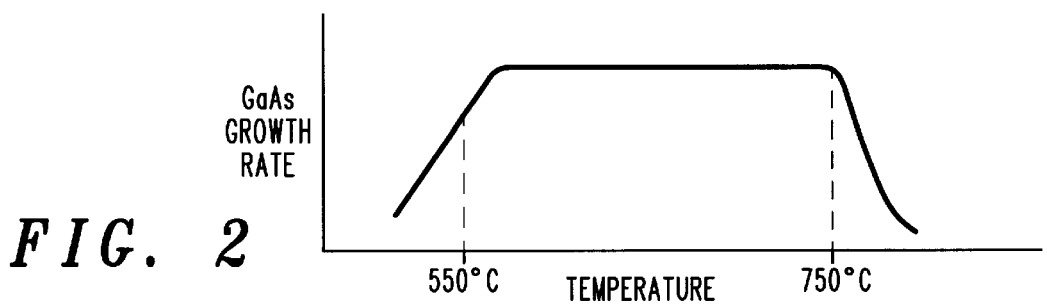
FIG. 2 is a graphical representation illustrating epitaxial growth rate versus temperature in the MOCVD process.

To overcome the interface contaminant problem, layer 14, including GaAs, is grown at a temperature below the normal temperature for growing GaAs epitaxial layers. Referring additionally to FIG. 2, a graphical representation is illustrated showing epitaxial growth rate versus substrate temperature in the MOCVD process. Typically, epitaxial layers are grown at a temperature between 550° C. and 750° C., which is illustrated in the graph of FIG. 2 as a generally flat growth rate. As is understood in the art, 750° C. is the temperature at which the growth rate drops as gallium begins to evaporate. In the flat growth rate region, the growth of gallium arsenide is limited only by the gas phase diffusion of the material to the epi/gas interface (diffusion limited growth). In this region, atoms readily migrate into proper positions in the crystal structure so that a substantially defect free crystalline material is grown.

Below 550° C. the growth rate decreases from the constant growth rate of the diffusion-limited region. At these lower temperatures, the epitaxial growth of material such as GaAs, is kinetically limited, i.e., some of the surface atoms may not find lattice sites and many act as interstitial or vacancy defects formed in the structure. These defects act as traps which absorb the mobile carriers at the contaminated interface. The lifetime of a free carrier in the defected GaAs is $\tau$, which is dependent upon the number and/or distribution of the defects. In this preferred embodiment, layer 14 containing GaAs was grown with a free carrier life, $\tau$, of less than 500 picoseconds and preferably a $\tau$ of approximately 100 picoseconds. Generally, the epitaxial growth temperature of GaAs layer 14 is between 500° C. and 550° C. Thus, GaAs layer 14 is a short-lifetime, compound semiconductor material.

Also, the thickness of GaAs layer 14 can be varied to change the likelihood of absorption or trapping of free carriers. It will of course be understood that too thick a layer provides unneeded recombination far from the interface, and requires too much growth time. It has been found that a layer of 500 Å to 1500 Å is adequate with a carrier lifetime of less than 500 picoseconds. In this preferred embodiment a layer of 1000 Å with a lifetime of 100 picoseconds was found to reduce leakage current in an Emode HIGFET device to values obtained in MBE-grown HIGFET devices.

Buffer 11 also includes a layer 15 of wide bandgap material, in this preferred embodiment, <$10^{15}$ cm$^{-3}$, p-type aluminum gallium arsenide (AlGaAs). Other lattice-matched, wide bandgap semiconductor materials, such as InGaP, could be used. The wide bandgap material of layer 15 forms a potential barrier with respect to GaAs layers 14 and 16 to prevent any free carriers, that are created near the interface or avoid traps in layer 14, from entering layer 15. This potential barrier also provides additional protection to prevent free carriers from entering or leaving an Emode device structure fabricated on buffer 11. The wide bandgap material of layer 15 is, in this embodiment, AlGaAS epitaxially grown with approximately 20% to 30% aluminum arsenide.

Referring specifically to FIG. 1, the simplified cross-sectional view illustrates stack 10 of compound semiconductor layers formed on AlGaAs layer 15 of buffer 11. In this specific embodiment of stack 10, a GaAs layer 16 is grown on AlGaAs layer 15 and a thin layer 17 of n-type, δ-doping is deposited on layer 16 with a GaAs layer 18 epitaxially grown on the upper surface thereof. In this embodiment, the n-type dopant is Si. A layer 20 of indium gallium arsenide (InGaAs), which generally defines the device channel, is epitaxially grown on GaAs layer 18. The InGaAs in channel layer 20 is specifically selected to produce some crystallographic strain and includes high indium arsenide content to improve carrier mobility in the device channel and, thereby, reduce the ON resistance. A layer 21 of low concentration, wide bandgap material, such as aluminum gallium arsenide (AlGaAs), is epitaxially grown on InGaAs channel layer 20 and a GaAs cap layer 22 is epitaxially grown on AlGaAs layer 21. In the MBE-grown HIGFET structure, it is common to position GaAs layer 16 directly upon the substrate. No buffer 11 is used.

Figure 3:
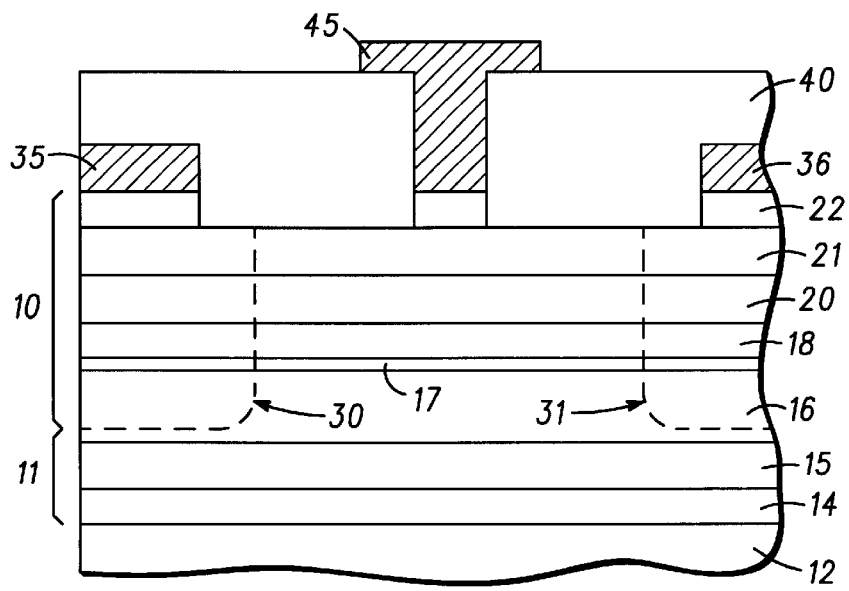
FIG. 3 is an heterojunction field effect transistor formed in the layer stack of FIG. 1 in accordance with the present invention.

Turning now to FIG. 3, with substrate 12, buffer 11, and stack 10 of compound semiconductor layers formed as described, GaAs cap layer 22 is covered with gate metal and masked using any appropriate technology.

A gate contact 45 is defined using a standard photo resist (not shown) and a combination of wet and dry etch processes may be used to define the gate metal contact 45 on the upper surface of GaAs cap layer 22. Layer 22 may or may not be removed at this point in the region between gate metal and ohmic metal contacts. FIG. 3 shows layer 22 removed. Here it will be understood by those skilled in the art that standard lithographic masking and etching techniques can be used. Specific details as to a preferred etching process can be found in U.S. Pat. No. 5,484,740, entitled "Method of Manufacturing a III–V Semiconductor Gate Structure", issued Jan. 16, 1996 and U.S. Pat. No. 5,619,064, entitled "III–V Semiconductor Gate Structure and Method of Manufacture", issued Apr. 8, 1997, both of which are included herein by reference. Dielectric layer 40 is deposited.

The gate metal is spaced from the source drain contact areas specific distances which are derived in a well known manner to provide desired characteristics (e.g. breakdown and operating voltages, etc.) for the Emode device.

Source and drain ohmic contact implants 30 and 31 (illustrated by broken lines) are introduced into the stack of compound semiconductor layers 10. Here it should be specifically noted that implants 30 and 31 extend at least through InGaAs channel layer 20, and preferably adjacent to AlGaAs layer 15 of buffer 11. Implants 30 and 31 are spaced apart to define therebetween an implant (and doping) free area in InGaAs channel layer 20 and AlGaAs layer 21 (also, GaAs layers 16 and 18 and buffer 11). In this specific embodiment, GaAs cap layer 22 is undoped and implants 30 and 31 are heavily doped (n+) with n-type material. Metal is deposited in the source and drain contact areas to form ohmic electrical contacts 35 and 36 on GaAs channel layer 22 in the source and drain contact areas.

A specific Emode device, generally designated 50, is illustrated and described to provide a better understanding of the invention. However, it will be understood that other Emode devices or other embodiments of the illustrated device may be fabricated in a stack of compound semiconductor materials on buffer 11 if desired.

Thus, an Emode semiconductor device is disclosed which includes a metal-organic chemical vapor deposition (MOCVD) epitaxial buffer with short-lifetime compound semiconductor material grown on a compound semiconductor substrate. In a preferred embodiment the buffer also includes a layer of AlGaAs. A stack of compound epitaxial layers are grown on the buffer and an enhancement mode semiconductor device is formed in the stack. The short-lifetime compound semiconductor material of the buffer absorbs or traps mobile carriers found at or near the substrate/epitaxy interface to substantially reduce leakage currents in the Emode device. Additional leakage current protection is provided by including a wide bandgap material in the buffer. Because of the particular operation of an Emode device as a normally-OFF device, leakage currents are particularly detrimental to Emode FET operation and fabrication of high quality Emode devices by MOCVD using a structure similar to that used by MBE growth has previously been problematic and unrepeatable. Since the disclosed devices can be fabricated by the MOCVD process, cost and availability of material is substantially improved.

While specific embodiments of the present invention have been shown and described, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating an enhancement mode semiconductor device comprising the steps of:

providing a compound semiconductor substrate; epitaxially growing on the substrate by metal-organic chemical vapor deposition an epitaxial buffer including short-lifetime compound semiconductor material;

epitaxially growing a stack of compound semiconductor layers on the buffer; and forming an enhancement mode semiconductor device in the stack;

wherein the step of epitaxially growing by metal-organic chemical vapor deposition the epitaxial buffer includes growing a layer of short-lifetime gallium arsenide on the substrate; and wherein the step of growing the short-lifetime layer of gallium arsenide includes growing gallium arsenide with a lifetime of less than 500 picoseconds.

2. A method of fabricating an enhancement mode semiconductor device as claimed in claim 1 wherein the step of growing the short-lifetime layer of gallium arsenide includes growing gallium arsenide with a lifetime of about 100 picoseconds.

3. A method of fabricating an enhancement mode semiconductor device as claimed in claim 1 wherein the step of epitaxially growing by metal-organic chemical vapor deposition the layer of short-lifetime gallium arsenide includes growing the layer of gallium arsenide at a temperature below approximately 550° C.

4. A method of fabricating an enhancement mode semiconductor device as claimed in claim 1 wherein the step of epitaxially growing by metal-organic chemical vapor deposition the epitaxial buffer includes growing a layer of wide bandgap material on the layer of short-lifetime gallium arsenide.

5. A method of fabricating an enhancement mode semiconductor device as claimed in claim 4 wherein the step of growing a layer of wide bandgap material on the layer of short-lifetime gallium arsenide includes growing a layer of aluminum gallium arsenide on the layer of short-lifetime gallium arsenide.

6. A method of fabricating an enhancement mode semiconductor device as claimed in claim 5 wherein the step of epitaxially growing by metal-organic chemical vapor deposition the layer of aluminum gallium arsenide includes growing the layer of aluminum gallium arsenide with approximately 20% to 30% aluminum arsenide.

7. A method of fabricating an enhancement mode semiconductor device comprising the steps of:

provinding a gallium arsenide substrate;

epitaxially growing by metal-organic chemical vapor deposition an epitaxial buffer including a layer of short-lifetime gallium arsenide on the substrate and a layer of wide bandgap material on the layer of short-lifetime gallium arsenide;

epitaxially growing a stack of compound semiconductor layers on the layer of wide bandgap material of the buffer; and forming an enhancement mode semiconductor device in the stack;

wherein the step of epitaxially growing by metal-organic chemical vapor deposition the layer of short-lifetime gallium arsenide includes growing the layer of gallium arsenide at a temperature below approximately 550° C.; and wherein the step of epitaxially growing by metal-organic chemical vapor deposition the short-lifetime layer of gallium arsenide includes growing the layer of gallium arsenide with a lifetime of less than 500 picoseconds.

8. A method of fabricating an enhancement mode semiconductor device as claimed in claim 7 wherein the step of epitaxially growing by metal-organic chemical vapor deposition the short-lifetime layer of gallium arsenide includes growing the layer of gallium arsenide with a lifetime of less than about 100 picoseconds.

9. A method of fabricating an enhancement mode semiconductor device as claimed in claim 7 wherein the step of epitaxially growing by metal-organic chemical vapor deposition the short-lifetime layer of gallium arsenide includes growing a layer of short-lifetime gallium arsenide with a thickness of approximately 1000 Å.

10. A method of fabricating an enhancement mode semiconductor device as claimed in claim 7 wherein the step of growing a layer of wide bandgap material on the layer of short-lifetime gallium arsenide includes growing a layer of aluminum gallium arsenide on the layer of short-lifetime gallium arsenide.

11. A method of fabricating an enhancement mode semiconductor device as claimed in claim 10 wherein the step of epitaxially growing by metal-organic chemical vapor deposition the layer of aluminum gallium arsenide includes growing a layer of aluminum gallium arsenide with a thickness of approximately 2500 Å.

* * * * *